(12) United States Patent
Chen et al.

(10) Patent No.: US 12,020,501 B2
(45) Date of Patent: Jun. 25, 2024

(54) SENSING CIRCUIT, DETECTION CONTROL METHOD, FINGERPRINT IDENTIFICATION MODULE AND DISPLAY APPARATUS

(71) Applicants: Beijing BOE Sensor Technology Co., Ltd., Beijing (CN); BOE Technology Group Co., Ltd., Beijing (CN)

(72) Inventors: Chao Chen, Beijing (CN); Shuai Xu, Beijing (CN); Wenchen Zhang, Beijing (CN); Bin Zhao, Beijing (CN); Xiaoqian Du, Beijing (CN); Luyao Fan, Beijing (CN); Binbin Xu, Beijing (CN); Zhenqian Zhao, Beijing (CN); Junyu Wu, Beijing (CN); Jingshu Zhang, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/781,900

(22) PCT Filed: Jun. 18, 2021

(86) PCT No.: PCT/CN2021/100842
§ 371 (c)(1),
(2) Date: Jun. 2, 2022

(87) PCT Pub. No.: WO2022/261924
PCT Pub. Date: Dec. 22, 2022

(65) Prior Publication Data
US 2024/0161535 A1    May 16, 2024

(51) Int. Cl.
*G06V 40/13* (2022.01)
*G06F 3/041* (2006.01)
(Continued)

(52) U.S. Cl.
CPC ........ *G06V 40/1318* (2022.01); *G06F 3/0412* (2013.01); *G06V 40/1365* (2022.01); *H01L 31/053* (2014.12); *H03K 17/6871* (2013.01)

(58) Field of Classification Search
CPC ............ G06V 40/1318; G06V 40/1365; H01L 31/053; G06F 3/0412; H03K 17/687
See application file for complete search history.

(56) References Cited

U.S. PATENT DOCUMENTS 6,647,133 B1    11/2003  Morita et al.
11,163,970 B1*  11/2021  Sammoura ......... G06V 40/1318
(Continued)

FOREIGN PATENT DOCUMENTS

| CN | 107092896 A | 8/2017 |
| CN | 109961023 A | 7/2019 |

(Continued)

*Primary Examiner* — Lixi C Simpson
(74) *Attorney, Agent, or Firm* — IPro, PLLC (57) ABSTRACT

Sensing circuit, detection control method, fingerprint identification module and display apparatus are provided. The sensing circuit comprises a photoelectric conversion element, an energy storage circuit, a switch control circuit, a discharge control circuit and a voltage conversion circuit. The photoelectric conversion element controls potential of first terminal of energy storage circuit according to received optical signal; the switch control circuit controls first terminal of energy storage circuit to be connected to or disconnected from conversion control node; the discharge control circuit controls conversion control node be connected to or disconnected from first voltage terminal; the voltage conversion circuit controls to output voltage signal outputted by output terminal according to second and/or third voltage signals. In the disclosure, by performing fingerprint identification by detecting duration length of the fourth voltage signal from output terminal, fingerprint image information (Continued)

can be obtained simply and efficiently, thereby improving fingerprint identification accuracy and preventing interference.

19 Claims, 4 Drawing Sheets

(51) Int. Cl.
*G06V 40/12* (2022.01)
*H01L 31/053* (2014.01)
*H03K 17/687* (2006.01)

(56) References Cited

U.S. PATENT DOCUMENTS

| | | |
|---|---|---|
| 2016/0364595 A1 | 12/2016 | Du et al. |
| 2020/0218870 A1 | 7/2020 | Kwon et al. |
| 2021/0117640 A1 | 4/2021 | Cao et al. |
| 2022/0051609 A1* | 2/2022 | Park ................... G09G 3/2092 |
| 2022/0197466 A1* | 6/2022 | Chang ................. G06F 3/0446 |

FOREIGN PATENT DOCUMENTS

| | | |
|---|---|---|
| CN | 111414792 A | 7/2020 |
| CN | 111738137 A | 10/2020 |
| IN | 107563315 A | 1/2018 |
| JP | 2000172833 A | 6/2000 |
| WO | 2021072666 A1 | 4/2021 |

\* cited by examiner

SENSING CIRCUIT, DETECTION CONTROL METHOD, FINGERPRINT IDENTIFICATION MODULE AND DISPLAY APPARATUS

CROSS-REFERENCE TO RELATED APPLICATIONS

The present application is the U.S. national phase of PCT Application No. PCT/CN2021/100842 filed on Jun. 18, 2021, the disclosure of which is incorporated hereby by reference in its entirety.

TECHNICAL FIELD

The present disclosure relates to the technical field of fingerprint identification, and in particular, to a sensing circuit, a detection control method, a fingerprint identification module, and a display apparatus.

BACKGROUND

At present, in the field of fingerprint identification, there are mainly three effective fingerprint identification technologies: capacitance detection, photoelectric detection and ultrasound detection. Among them, the photoelectric detection has attracted more and more attention due to its excellent detection performance. The existing products using photoelectric detection generally include a photodiode and a switching transistor. Due to the difference in the ridge of the finger, the light from the light source shining on the finger may result in different reflections, so that the light intensities at photodiode devices will be different, and thus, different photocurrents and voltage signals with different amplitudes. Under the control of the thin film switching transistor, the voltage signals can be converted into digital signals as read out, so that an image having different gray values at valleys and ridges. Then, after an image processing, an information extraction is performed on the gray-scale image to obtain a binary image for fingerprint information identification. In this process, the photoelectric signal detection is interfered by the noise easily, and the gray-scale image is not uniform, which causes difficulties in the process of image processing.

SUMMARY

In one aspect, embodiments of the present disclosure provide a sensing circuit, including a photoelectric conversion element, an energy storage circuit, a switch control circuit, a discharge control circuit, and a voltage conversion circuit, where,
  a first terminal of the energy storage circuit is electrically connected to the photoelectric conversion element, and the energy storage circuit is configured to store electrical energy;
  the photoelectric conversion element is configured to control a potential of the first terminal of the energy storage circuit according to a received optical signal;
  the switch control circuit is electrically connected to a switch control line, a first terminal of the energy storage circuit and a conversion control node, and the switch control circuit is configured to control the first terminal of the energy storage circuit to be connected to or disconnected from the conversion control node under the control of a switch control signal provided by the switch control line;
  the discharge control circuit is electrically connected to the conversion control node and a first voltage terminal, and is configured to control the conversion control node to be connected to or disconnected from the first voltage terminal under the control of a potential of the conversion control node; and
  the voltage conversion circuit is electrically connected to the conversion control node, a second voltage terminal, a third voltage terminal and an output terminal, and the voltage conversion circuit is configured to control, under the control of a second voltage signal provided by the second voltage terminal and the potential of the conversion control node, a voltage signal outputted by the output terminal according to the second voltage signal and/or a third voltage signal provided by the third voltage terminal.

Optionally, the voltage conversion circuit comprises a first conversion circuit and a second conversion circuit;
  the first conversion circuit is electrically connected to the conversion control node, the output terminal and the third voltage terminal, and the first conversion circuit is configured to control the output terminal to be connected to or disconnected from the third voltage terminal under the control of the potential of the conversion control node; and
  the second conversion circuit is electrically connected to the second voltage terminal and the output terminal, and the second conversion circuit is configured to control the output terminal to be connected to or disconnected from the second voltage terminal under the control of the second voltage signal provided by the second voltage terminal.

Optionally, the first conversion circuit comprises a first transistor; and
  a control electrode of the first transistor is electrically connected to the conversion control node, a first electrode of the first transistor is electrically connected to the output terminal, and a second electrode of the first transistor is electrically connected to the third voltage terminal.

Optionally, the second conversion circuit comprises a second transistor; and
  a control electrode of the second transistor and a first electrode of the second transistor are electrically connected to the second voltage terminal, and a second electrode of the second transistor is electrically connected to the output terminal.

Optionally, the photoelectric conversion element comprises a photodiode and the energy storage circuit comprises a storage capacitor; a first terminal of the storage capacitor is the first terminal of the energy storage circuit; and
  a cathode of the photodiode is electrically connected to the first terminal of the storage capacitor, an anode of the photodiode is electrically connected to a second terminal of the storage capacitor, and the second terminal of the storage capacitor is electrically connected to a bias voltage terminal.

Optionally, the switch control circuit comprises a third transistor; and
  a control electrode of the third transistor is electrically connected to the switch control line, a first electrode of the third transistor is electrically connected to the conversion control node, and a second electrode of the third transistor is electrically connected to a first terminal of the energy storage circuit.

Optionally, the discharge control circuit comprises a fourth transistor; and
  a first electrode of the fourth transistor is electrically connected to the first voltage terminal, and a control electrode of the fourth transistor and a second electrode of the fourth transistor are electrically connected to the conversion control node.

In a second aspect, embodiments of the present disclosure provide a detection control method, applied to the above-mentioned sensing circuit, the detection period comprises a reset stage and a detection stage arranged in sequence; the detection stage comprises a discharge time segment and a holding time segment; the detection control method comprises:

in the reset stage, controlling, by the switch control circuit, the first terminal of the energy storage circuit to be disconnected from the conversion control node under the control of the switch control signal, and controlling, by the voltage conversion circuit under the control of the potential of the conversion control node and the second voltage signal, to output the second voltage signal through the output terminal;

at the beginning of the discharge time segment, controlling, by the switch control circuit, the first terminal of the energy storage circuit to be connected to the conversion control node under the control of the switch control signal, controlling, by the photoelectric conversion element, the potential of the first terminal of the energy storage circuit to be changed according to the received optical signal, and controlling, by the voltage conversion circuit under the control of the second voltage signal and the potential of the conversion control node, to output the fourth voltage signal through the output terminal according to the second voltage signal and the third voltage signal;

in the discharge time segment controlling, the discharge control circuit, the conversion control node to be connected to the first voltage terminal under the control of the potential of the conversion control node, so that charge stored in the energy storage circuit is discharged to the first voltage terminal so as to y change the potential of the conversion control node accordingly, and the discharge time segment is ended when the second voltage signal is controlled, by the voltage conversion circuit under the control of the potential of the conversion control node, to be outputted through the output terminal; and in the holding time segment, controlling, by the voltage conversion circuit, to output the second voltage signal through the output terminal under the control of the potential of the conversion control node.

Optionally, the voltage conversion circuit comprises a first conversion circuit and a second conversion circuit;

the step of controlling, by the voltage conversion circuit under the control of the second voltage signal and the potential of the conversion control node, to output the second voltage signal through the output terminal comprises:

controlling, by the first conversion circuit under the control of the potential of the conversion control node, the output terminal to be disconnected from the third voltage terminal; controlling, by the second conversion circuit under the control of the second voltage signal, the output terminal to be connected to the second voltage terminal; and the step of controlling, by the voltage conversion circuit under the control of the second voltage signal and the potential of the conversion control node, to output the fourth voltage signal through the output terminal according to the second voltage signal and the third voltage signal comprises:

controlling, by the first conversion circuit under the control of the potential of the conversion control node, the output terminal to be connected to the third voltage terminal; controlling, by the second conversion circuit under the control of the second voltage signal, the output terminal to be connected to the second voltage terminal.

In a third aspect, embodiments of the present disclosure provide a fingerprint identification module comprising an identification circuit and the sensing circuit as described above;

the identification circuit is electrically connected to the output terminal comprised in the sensing circuit; and the identification circuit is configured to perform a fingerprint identification according to the voltage signal outputted by the output terminal.

Optionally, the identification circuit comprises a signal providing circuit, a time measurement circuit and a master control circuit;

the signal providing circuit is electrically connected to the switch control line and is configured to provide the switch control signal to the switch control line;

the time measurement circuit is electrically connected to the output terminal and is configured to detect a time in which the voltage signal outputted by the output terminal is the fourth voltage signal; and the master control circuit is electrically connected to the time measurement circuit, and the master control circuit is configured to calculate an intensity of the optical signal received by the photoelectric conversion element according to the time, and perform the fingerprint identification according to the intensity of the optical signal.

In a fourth aspect, embodiments of the present disclosure provide a display apparatus, comprising the fingerprint identification module as described above.

DETAILED DESCRIPTION

The technical solution in embodiments of the present disclosure will be described clearly and completely below in conjunction with the accompanying drawings for the embodiments of the present disclosure. Apparently, the described embodiment is only some, rather than all, embodiments of the present disclosure. Based on the embodiments of the present disclosure, all other embodiments obtained by a person of ordinary skill in the art without involving any inventive effort fall within the scope of the present disclosure.

The transistor in all embodiments of the present disclosure may be a triode, a thin-film transistor or a field effect transistor or other devices having similar characteristics. In the embodiments of the present disclosure, to distinguish two electrodes of the transistor other than control electrode, one electrode is referred to as the first electrode and the other electrode is referred to as the second electrode.

In practical operation, in a case that the transistor is a triode, the control electrode may be a base electrode, the first electrode may be a collector electrode, and the second electrode may be an emitter electrode; optionally, the control electrode may be a base electrode, the first electrode may be an emitter electrode, and the second electrode may be a collector electrode.

In practical operation, in a case that the transistor is a thin-film transistor or a field effect transistor, the control electrode may be a gate electrode, the first electrode may be a drain electrode, and the second electrode may be a source electrode; optionally, the control electrode may be a gate electrode, the first electrode may be a source electrode, and the second electrode may be a drain electrode.

Figure 1:
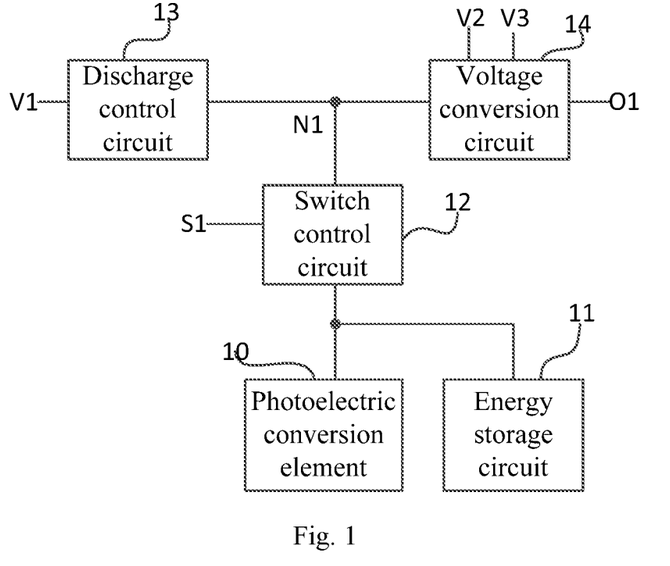
FIG. 1 is a structure diagram of a sensing circuit according to embodiments of the present disclosure.

As shown in FIG. 1, according to embodiments of the present disclosure, a sensing circuit comprises a photoelectric conversion element 10, an energy storage circuit 11, a switch control circuit 12, a discharge control circuit 13, and a voltage conversion circuit 14.

A first terminal of the energy storage circuit 11 is electrically connected to the photoelectric conversion element 10, and the energy storage circuit 11 is configured to store electrical energy.

The photoelectric conversion element 10 is configured to control a potential of the first terminal of the energy storage circuit 11 according to a received optical signal.

The switch control circuit 12 is electrically connected to a switch control line S1, the first terminal of the energy storage circuit 11 and a conversion control node N1, and the switch control circuit 12 is configured to control the first terminal of the energy storage circuit 11 to be connected to or disconnected from the conversion control node N1 under the control of a switch control signal provided by the switch control line S1;

The discharge control circuit 13 is electrically connected to the conversion control node N1 and a first voltage terminal V1, and the discharge control circuit 13 is configured to control the conversion control node N1 to be connected to or disconnected from the first voltage terminal V1 under the control of the potential of the conversion control node N1;

The voltage conversion circuit 14 is electrically connected to the conversion control node N1, a second voltage terminal V2, a third voltage terminal V3 and an output terminal O1, and the voltage conversion circuit 14 is configured to control, under the control of the potential of the conversion control node N1 and a second voltage signal provided by the second voltage terminal V2, a voltage signal outputted by the output terminal O1 according to the second voltage signal and/or a third voltage signal provided by the third voltage terminal V3.

In at least one embodiment of the present disclosure, the second voltage signal and the third voltage signal are different.

When the sensing circuit as shown in FIG. 1 according to the embodiments of the present disclosure is in operation, a detection period may comprise a reset stage and a detection stage arranged in sequence; the detection stage comprises a discharge time segment and a holding time segment.

In the reset stage, the switch control circuit 12 controls the first terminal of the energy storage circuit 11 to be disconnected from the conversion control node N1 under the control of the switch control signal, and the voltage conversion circuit 14 controls to output the second voltage signal through the output terminal O1 under the control of the second voltage signal and the potential of the conversion control node.

At the beginning of the discharge time segment, the switch control circuit 12 controls the first terminal of the energy storage circuit 11 to be connected to the conversion control node N1 under the control of the switch control signal; the photoelectric conversion element 10 controls the potential of the first terminal of the energy storage circuit 11 to be changed according to the received optical signal; the voltage conversion circuit 14 controls, under the control of the second voltage signal and the potential of the conversion control node N1, to output a fourth voltage signal through the output terminal O1 according to the second voltage signal and the third voltage signal;

In the discharge time segment, the discharge control circuit 13 controls the conversion control node N1 to be connected to the first voltage terminal V1 under the control of the potential of the conversion control node N1, so that charges stored in the energy storage circuit 11 discharges to the first voltage terminal V1 to change the potential of the conversion control node N1 accordingly. The discharging continues until the voltage conversion circuit 14 controls, under the control of the potential of the conversion control node N1, to output the second voltage signal through the output terminal O1, and the discharge time segment ends.

In the holding time segment, the voltage conversion circuit 14 controls, under the control of the potential of the conversion control node N1, to output the second voltage signal through the output terminal O1.

When the sensing circuit as shown in FIG. 1 according to the embodiments of the present disclosure is in operation, at the beginning of the discharge time segment, the photoelectric conversion element 10 controls the potential of a first terminal of the energy storage circuit 11 to be changed according to the received optical signal, while the potential at the first terminal of the energy storage circuit 11 is related to the intensity of the optical signal received by the photoelectric conversion element 10, and a duration of the discharge time segment is also related to the intensity of the optical signal.

Optionally, the first voltage terminal and the third voltage terminal may be a ground terminal and the second voltage terminal may be a negative voltage terminal.

When the sensing circuit as shown in FIG. 1 according to the embodiments of the present disclosure is in operation, the fingerprint identification can be performed by detecting a length of a duration during which the output terminal O1 outputs the fourth voltage signal. The fingerprint image information can be obtained in a simple and efficient manner, thus effectively improving the accuracy of fingerprint acquisition and preventing the fingerprint acquisition from being interfered.

According to the embodiments of the present disclosure, a traditional detection mode for detecting the amplitude of fingerprint signal voltage can be replaced with a mode for detecting a difference in the potential holding time due to different voltage signal values. In the disclosed mode, the fingerprint information is obtained by detecting the potential holding time, which cannot be interfered by noise easily. Currently, the accuracy of a detection chip for detecting the time (the detection chip may include a time measurement circuit and a master control circuit in FIG. 8) has reached an order of picoseconds (ps), which can satisfy the accuracy requirement of the detection.

Figure 2:
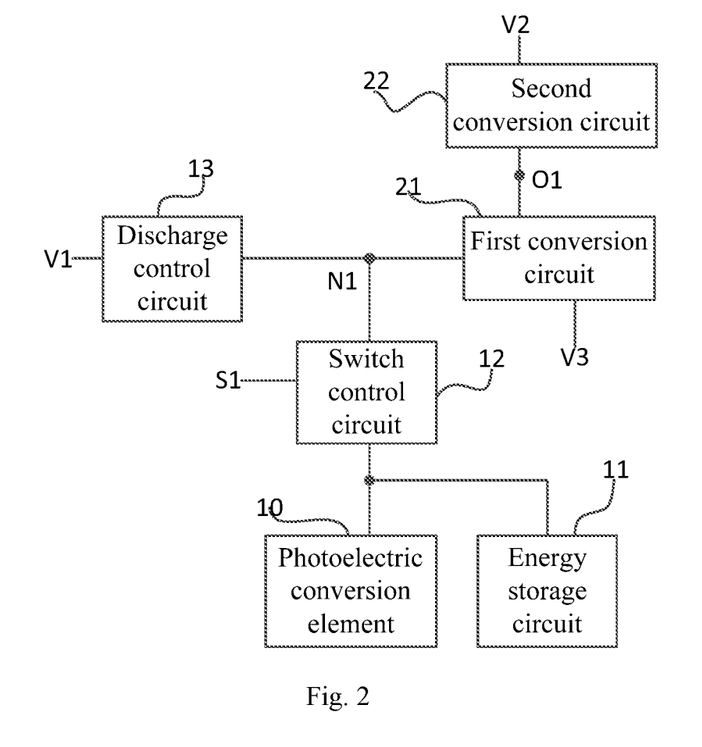
FIG. 2 is a structure diagram of a sensing circuit according to at least one embodiment of the present disclosure.

In at least one embodiment of the present disclosure, as shown in FIG. 2, the voltage conversion circuit may comprise a first conversion circuit 21 and a second conversion circuit 22;

the first conversion circuit 21 is electrically connected to the conversion control node N1, the output terminal O1 and a third voltage terminal V3, and the first conversion circuit 21 is configured to control the output terminal O1 to be connected to or disconnected from the third voltage terminal V3 under the control of the potential of the conversion control node N1; and the second conversion circuit 22 is electrically connected to the second voltage terminal V2 and the output terminal O1, and the second conversion circuit 22 is configured to control the output terminal O1 to be connected to or disconnected from the second voltage terminal V2 under the control of a second voltage signal provided by the second voltage terminal V2.

When the sensing circuit shown in FIG. 2 according to the embodiments of the present disclosure is in operation, the first conversion circuit 21 may control O1 to be connected to or disconnected from V3 under the control of the potential of N1, and the second conversion circuit 22 may control O1 to be connected to or disconnected from V1 under the control of the second voltage signal.

Optionally, the first conversion circuit comprises a first transistor; and a control electrode of the first transistor is electrically connected to the conversion control node, a first electrode of the first transistor is electrically connected to the output terminal, and a second electrode of the first transistor is electrically connected to the third voltage terminal.

Optionally, the second conversion circuit comprises a second transistor; and a control electrode of the second transistor and a first electrode of the second transistor are electrically connected to the second voltage terminal, and a second electrode of the second transistor is electrically connected to the output terminal.

Figure 3:
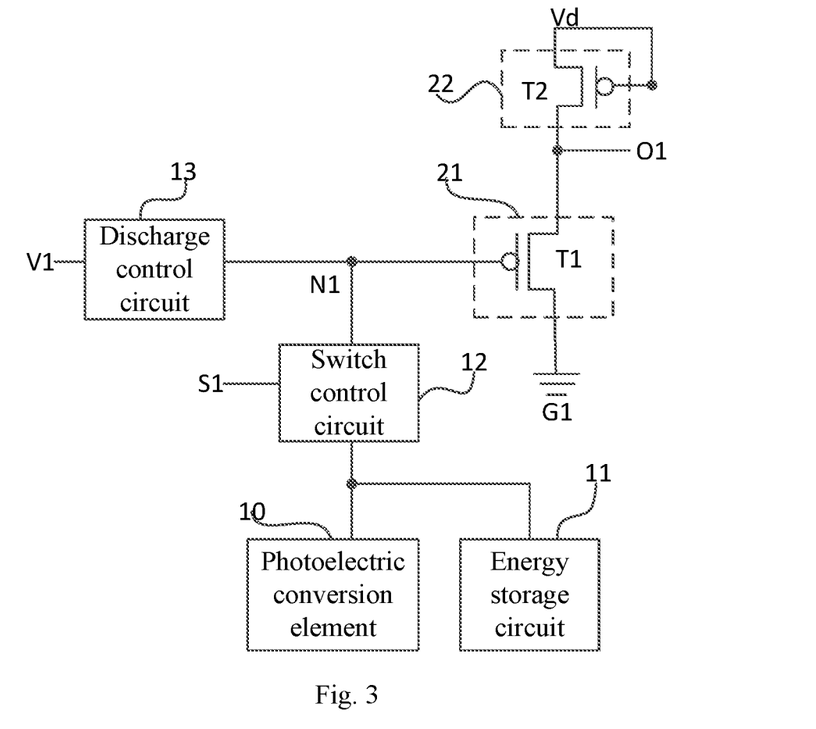
FIG. 3 is a structure diagram of a sensing circuit according to at least one embodiment of the present disclosure.

As shown in FIG. 3, on the basis of the sensing circuit shown in FIG. 2 according to at least one embodiment, the first conversion circuit 21 comprises a first transistor T1, and the second conversion circuit 22 comprises a second transistor T2;

a gate electrode of T1 is electrically connected to the conversion control node N1, a drain electrode of T1 is electrically connected to the output terminal O1, and a source electrode of T1 is electrically connected to a ground terminal G1; and a gate electrode of T2 and a drain electrode of T2 are both electrically connected to a negative voltage terminal Vd, and a source electrode of T2 is electrically connected to the output terminal O1.

In the sensing circuit shown in FIG. 3, according to at least one embodiment, T1 and T2 may both be a p-type thin-film transistor.

When the sensing circuit as shown in FIG. 3 according to at least one embodiment is in operation, both T1 and T2 are turned on when the potential of N1 is a low voltage, and by setting the width-to-length ratio of T1 to be greater than the width-to-length ratio of T2, O1 is caused to outputs the fourth voltage signal, and a voltage value of the fourth voltage signal is 0.

When the potential of N1 is greater than or equal to Vth (Vth is a threshold voltage of T1), T1 is turned off, T2 is turned on, O1 outputs a negative voltage signal, and the negative voltage terminal Vd is used to output the negative voltage signal.

In at least one embodiment shown in FIG. 3, the second voltage terminal is the negative voltage terminal Vd and the third voltage terminal is ground terminal.

In at least one embodiment shown in FIG. 3, a voltage value of a negative voltage signal provided by the negative voltage terminal Vd may be −7V; optionally, the voltage value of the negative voltage signal may be greater than or equal to −10V and less than or equal to −7V.

Figure 4:
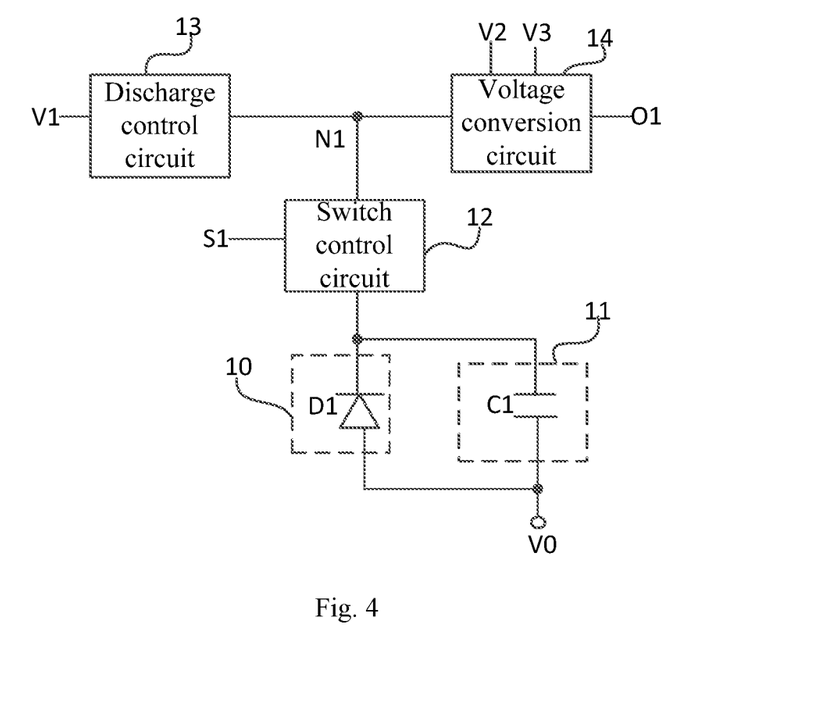
FIG. 4 is a structure diagram of a sensing circuit according to at least one embodiment of the present disclosure.

In at least one embodiment of the present disclosure, as shown in FIG. 4, on the basis of the sensing circuit shown in FIG. 1 according to embodiments the disclosure, the photoelectric conversion element 10 comprises a photodiode D1, and the energy storage circuit 11 comprises a storage capacitor C1; a first terminal of the storage capacitor C1 is the first terminal of the energy storage circuit; and a cathode of the photodiode D1 is electrically connected to the first terminal of the storage capacitor C1, an anode of the photodiode D1 is electrically connected to a second terminal of the storage capacitor C1, and the second terminal of the storage capacitor C1 is electrically connected to a bias voltage terminal V0.

In the sensing circuit shown in FIG. 4, according to at least one embodiment, when the photodiode D1 is needed to perform a photoelectric conversion, a voltage value of a bias voltage provided by the bias voltage terminal V0 is less than a potential of the cathode of the photodiode D1.

The photodiode D1 may convert an optical signal received by the photodiode D1 into a charge, and store the charge in the first terminal of C1. At the beginning of the discharge time segment, T1 starts to be turned on; and the potential of the first terminal of C1 is related to the intensity of the optical signal received by D1. When the intensity of the optical signal is weak, the absolute value of the potential of the first terminal of C1 is small; when the intensity of the optical signal is strong, the absolute value of the potential of the first terminal of C1 is large.

In at least one embodiment of the present disclosure, at the beginning of the discharge time segment, when T1 starts to be turned on, the potential of the first terminal of C1 may be less than 0.

In at least one embodiment shown in FIG. 4, the voltage value of the bias voltage may be −7V.

Optionally, the switch control circuit comprises a third transistor; and a control electrode of the third transistor is electrically connected to the switch control line, a first electrode of the third transistor is electrically connected to the conversion control node, and a second electrode of the third transistor is electrically connected to the first terminal of the energy storage circuit.

Optionally, the discharge control circuit comprises a fourth transistor; and a first electrode of the fourth transistor is electrically connected to the first voltage terminal, and a control electrode of the fourth transistor and a second electrode of the fourth transistor are electrically connected to the conversion control node.

Figure 5:
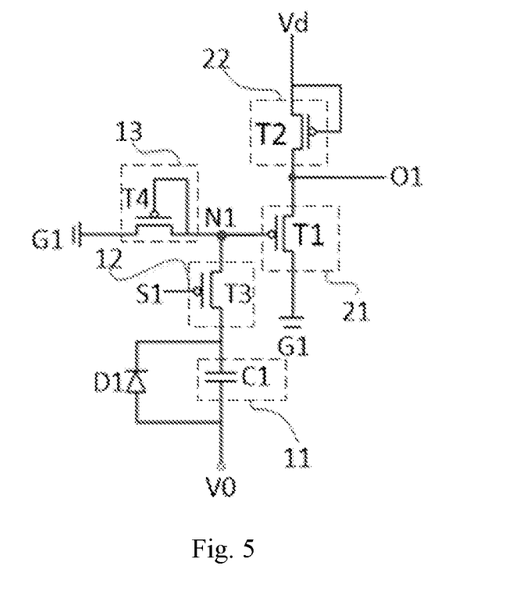
FIG. 5 is a circuit diagram of a sensing circuit according to at least one embodiment of the present disclosure.

As shown in FIG. 5, according to at least one embodiment of the present disclosure, the sensing circuit comprises a photodiode D1, an energy storage circuit 11, a switch control circuit 12, a discharge control circuit 13 and a voltage conversion circuit;

the energy storage circuit 11 comprises a storage capacitor C1;

the voltage conversion circuit comprises a first conversion circuit 21 and a second conversion circuit 22;

the first conversion circuit 21 comprises a first transistor T1, and the second conversion circuit 22 comprises a second transistor T2; the switch control circuit 12 comprises a third transistor T3; the discharge control circuit 13 comprises a fourth transistor T4;

a gate electrode of T1 is electrically connected to a conversion control node N1, a drain electrode of T1 is electrically connected to an output terminal O1, and a source electrode of T1 is electrically connected to a ground terminal G1;

a gate electrode of T2 and a drain electrode of T2 are both electrically connected to a negative voltage terminal Vd, and a source electrode of T2 is electrically connected to the output terminal O1;

a gate electrode of T3 is electrically connected to a switch control line S1, a source electrode of T3 is electrically connected to a cathode of D1, and a drain electrode of T3 is electrically connected to a gate electrode of T1;

a gate electrode of T4 and a drain electrode of T4 are electrically connected to the conversion control node N1, and a source electrode of T4 is electrically connected to the ground terminal G1; and the cathode of D1 is electrically connected to a first terminal of C1, an anode of D1 is electrically connected to a second terminal of C1, and the second terminal of C1 is electrically connected to a bias voltage terminal V0.

In the sensing circuit shown in FIG. 5, according to at least one embodiment, all transistors are p-type thin-film transistors, the first voltage terminal is the ground terminal G1, the second voltage terminal is the negative voltage terminal Vd, and the third voltage terminal is the ground terminal G1.

Figure 6:
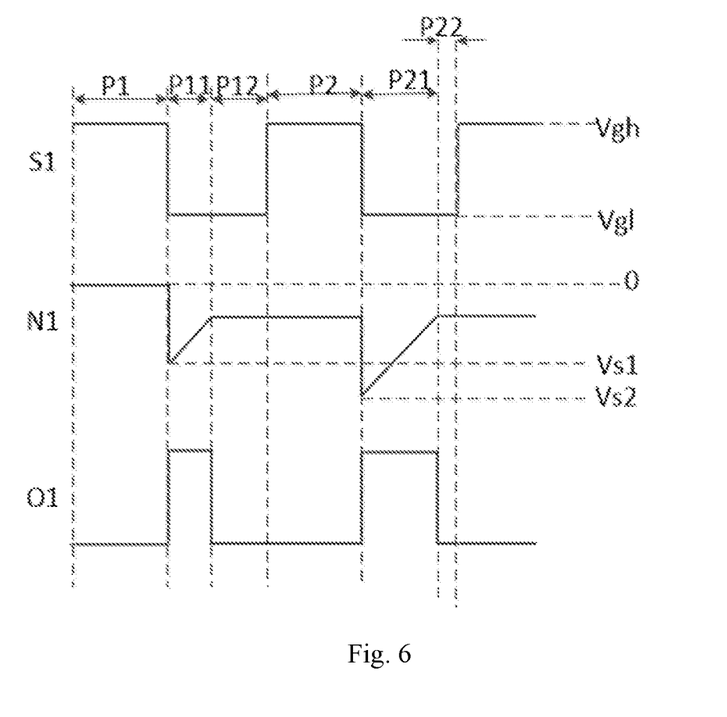
FIG. 6 is an operating timing diagram of the sensing circuit shown in FIG. 5 according to at least one embodiment.

As shown in FIG. 6, when the sensing circuit shown in FIG. 5 according to at least one embodiment of the present disclosure is in operation, in a first reset stage P1, S1 provides a high voltage signal Vgh, T3 is turned off; the potential of N1 is 0, T4 is turned off, T1 is turned off and T2 is turned on, and O1 outputs a negative voltage signal provided by Vd;

in a first discharge time segment P11 comprised in a first detection stage, S1 provides a low voltage signal Vg1, and T3 is turned on; D1 controls the potential of the first terminal of C1 to be Vs1 according to the received optical signal, and the potential of N1 is Vs1 as T3 is turned on; Vs1 is less than 0, T4 is turned on, T1 is turned on, T2 is turned on, O1 outputs the fourth voltage signal, and the voltage value of the fourth voltage signal is 0; the charge stored in C1 discharges to G1 through T4 so as to increase the potential of N1 until the potential of N1 increases to Vth (Vth is the threshold voltage of T1), T1 is turned off, and O1 outputs the negative voltage signal provided by Vd; then entering a first holding time segment P12 comprised in the first detection stage;

in the first holding time segment P12, S1 provides a low voltage signal Vg1, T3 is turned on, the potential of N1 is Vt; T1 is turned off, T2 is turned on, and O1 outputs the negative voltage signal provided by Vd;

in a second reset stage P2, S1 provides the high voltage signal Vgh, T3 is turned off, the potential of N1 is 0; T4 is turned off, T1 is turned off, T2 is turned on, and O1 outputs the negative voltage signal provided by Vd;

in a first discharge time segment P21 comprised in a second detection stage, S1 provides the low voltage signal Vg1, and T3 is turned on; D1 controls the potential of the first terminal of C1 to be Vs2 according to the received optical signal, and the potential of N1 is Vs2 as T3 is turned on; Vs2 is less than 0, T4 is turned on, T1 is turned on and T2 is turned on, O1 outputs the fourth voltage signal, and the voltage value of the fourth voltage signal is 0; the charge stored in C1 discharges to G1 through T4 so as to increase the potential of N1 until the potential of N1 has increased to Vth (Vth is the threshold voltage of T1), T1 is turned off, and O1 outputs the negative voltage signal provided by Vd; then entering a second holding time segment P22 comprised in the second detection stage; and in the second holding time segment P22, S1 provides the low voltage signal Vg1, T3 is turned on, the potential of N1 is Vth; T1 is turned off, T2 is turned on, O1 outputs the negative voltage signal provided by Vd.

In at least one embodiment of the present disclosure, the voltage value of Vgh may be 6V and the voltage value of Vg1 can be −6V.

As shown in FIG. 6, the absolute value of Vs1 is less than the absolute value of Vs2, the intensity of the optical signal received by D1 at the beginning of the first discharge time segment P11 is less than the intensity of the optical signal received by D1 at the beginning of the second discharge time segment P21, so that the duration t1 of the first discharge time segment P11 is less than the duration of the second discharge time segment P21. When a fingerprint identification is performed, by detecting, with a time measurement circuit, a duration for which O1 continuously outputs the fourth voltage signal, the intensity of the optical signal received by D1 can be determined, and then the fingerprint identification can be performed to determine information about ridges and valleys of a finger.

When the photodiode D1 is illuminated by the light reflected by the ridge valley of the finger, since the lights reflected by the ridge and the valley are different in brightness, so that the photodiode converts optical signals into different signal voltages, different signal voltages will generate different times for which O1 outputs the fourth voltage signal. The intensity of the optical signal can be obtained by measuring a corresponding time length.

The detection control method according to the embodiments of the present disclosure is applied to the above-mentioned sensing circuit, and a detection period comprises a reset stage and a detection stage arranged in sequence; the detection stage comprises a discharge time segment and a holding time segment; the detection control method comprises:

in the reset stage, controlling, by a switch control circuit under the control of a switch control signal, a first terminal of an energy storage circuit to be disconnected from a conversion control node, and controlling, by a voltage conversion circuit under the control of a second voltage signal and a potential of the conversion control node, to output a second voltage signal through an output terminal;

at the beginning of the discharge time segment, controlling, by the switch control circuit under the control of the switch control signal, the first terminal of the energy storage circuit to be connected to the conversion control node, controlling, by a photoelectric conversion element, a potential of the first terminal of the energy storage circuit to be changed according to a received optical signal, and controlling, by the voltage conversion circuit under the control of the second voltage signal and the potential of the conversion control node, to output a fourth voltage signal through the output terminal according to the second voltage signal a third voltage signal;

in the discharge time segment, controlling, by a discharge control circuit under the control of the potential of the conversion control node, the conversion control node to be connected to a first voltage terminal, so that the charge stored in the energy storage circuit is discharged to the first voltage terminal to change the potential of the conversion control node correspondingly, until the voltage conversion circuit control the output terminal to output the second voltage signal under the control of the potential of the conversion control node, and the discharge time segment ends;

in the holding time segment, controlling, by the voltage conversion circuit under the control of the potential of the conversion control node, to output the second voltage signal through the output terminal.

In the detection control method according to the embodiments of the present disclosure, at the beginning of the discharge time segment, the photoelectric conversion element controls to change the potential of the first terminal of the energy storage circuit according to the received optical signal, and the potential of the first terminal of the energy storage circuit 11 is related to the intensity of the optical signal received by the photoelectric conversion element, while the duration of the discharge time segment is also related to the intensity of the optical signal.

In at least one embodiment of the present disclosure, the voltage conversion circuit comprises a first conversion circuit and a second conversion circuit;

the step of controlling, by a voltage conversion circuit under the control of a second voltage signal and a potential of the conversion control node, to output a second voltage signal through an output terminal comprises:

controlling, by the first conversion circuit under the control of the potential of the conversion control node, the output terminal to be disconnected from the third voltage terminal; controlling, by the second conversion circuit under the control of the second voltage signal, the output terminal to be connected to a second voltage terminal;

the step of controlling, by the voltage conversion circuit under the control of the second voltage signal and the potential of the conversion control node, to output a fourth voltage signal through the output terminal according to the second voltage signal a third voltage signal comprises:

controlling, by the first conversion circuit under the control of the potential of the conversion control node, the output terminal to be connected to the third voltage terminal; controlling, by the second conversion circuit under the control of the second voltage signal, the output terminal to be connected to the second voltage terminal.

In a specific implementation, the voltage conversion circuit may comprise the first conversion circuit and the second conversion circuit, the first conversion circuit controls the output terminal to be connected to or disconnected from the third voltage terminal under the control of the potential of the conversion control node, and the second conversion circuit controls the output terminal to be connected to or disconnected from the second voltage terminal under the control of the second voltage signal.

Figure 7:
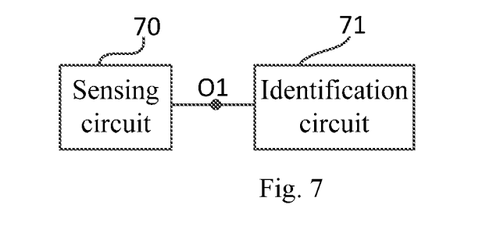
FIG. 7 is a structure diagram of a fingerprint identification module according to embodiments of the present disclosure.

As shown in FIG. 7, the fingerprint identification module according to the embodiments of the present disclosure comprises an identification circuit 71 and the above-mentioned sensing circuit 70;

the identification circuit 71 is electrically connected to the output terminal O1 comprised in the sensing circuit 70;

the identification circuit 71 is configured to perform a fingerprint identification according to a voltage signal outputted by the output terminal O1.

The fingerprint identification module according to the embodiments of the present disclosure calculates the intensity of the optical signal received by the photoelectric conversion element with a time in which the voltage signal outputted by the output terminal is the fourth voltage signal, and the fingerprint identification module performs the fingerprint identification according to the intensity of the optical signal.

Figure 8:
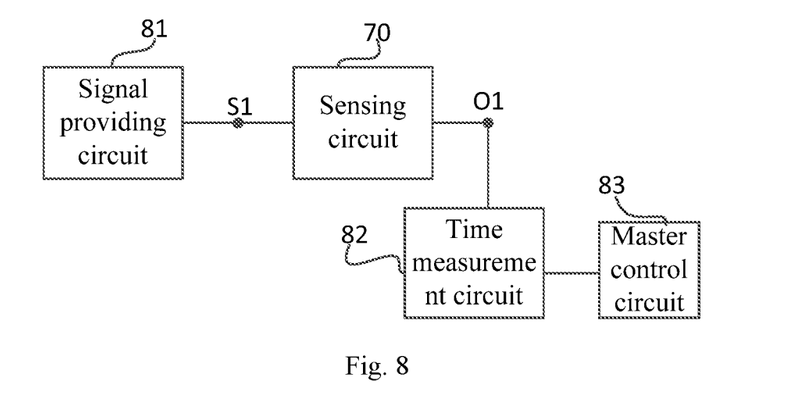
FIG. 8 is a structure diagram of a fingerprint identification module according to at least one embodiment of the present disclosure.

Optionally, as shown in FIG. 8, the identification circuit may comprise a signal providing circuit 81, a time measurement circuit 82 and a master control circuit 83;

the signal providing circuit 81 is electrically connected to a switch control line S1 and is configured to provide a switch control signal to the switch control line S1; the sensing circuit 70 is electrically connected to the switch control line S1;

the time measurement circuit 82 is electrically connected to the output terminal O1 and is configured to detect a time for which the voltage signal outputted by the output terminal O1 is the fourth voltage signal; and the master control circuit 83 is electrically connected to the time measurement circuit 82, and is configured to calculate the intensity of the optical signal received by the photoelectric conversion element according to the time, to obtain image information of an fingerprint according to the intensity of the optical signal, and to perform a fingerprint identification.

With the fingerprint identification module according to the embodiments of the present disclosure, gray information map for the ridge(s) and valley(s) of the fingerprint can be obtained quickly, which has a high information intensity and is not disturbed by noise easily.

In at least one embodiment of the present disclosure, the master control circuit can be a master chip.

Figure 9:
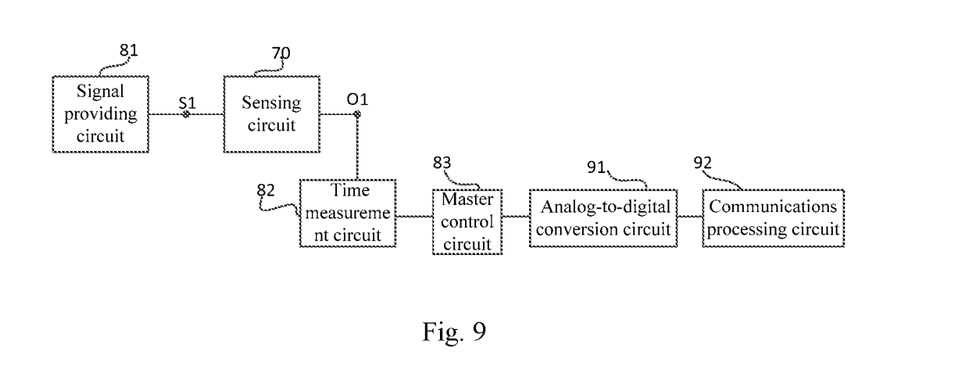
FIG. 9 is a structure diagram of the fingerprint identification module according to at least one embodiment of the present disclosure.

As shown in FIG. 9, in at least one embodiment, the fingerprint identification module may further comprise an analog-to-digital conversion (ADC) circuit 91 and a communications processing circuit 92, wherein the ADC circuit 91 is electrically connected to the master control circuit 83 and the communications processing circuit 92;

the ADC circuit 91 is configured for performing an analog-to-digital conversion on a signal outputted by the master control circuit 83, and the signal obtained after the analog-to-digital conversion is performed is processed by the communications processing circuit 92 and then outputted.

A display apparatus according to embodiments of the present disclosure comprises the above-mentioned fingerprint identification module.

The display apparatus provided by the embodiments of the present disclosure may be any product or component with a display function such as a mobile phone, a tablet computer, a television, a display, a notebook computer, a digital photo frame, a navigator, etc.

The detailed description illustrates some embodiments of the present disclosure. It will be appreciated by those skilled in the art that various modifications and adaptations may be made without departing from the principles of the present disclosure, and such modifications and adaptations should fall within the protection scope of the present disclosure.

What is claimed is:

1. A sensing circuit, comprising: a photoelectric conversion element, an energy storage circuit, a switch control circuit, a discharge control circuit, and a voltage conversion circuit, wherein
   a first terminal of the energy storage circuit is electrically connected to the photoelectric conversion element, and the energy storage circuit is configured to store electrical energy;
   the photoelectric conversion element is configured to control a potential of the first terminal of the energy storage circuit according to a received optical signal;
   the switch control circuit is electrically connected to a switch control line, the first terminal of the energy storage circuit and a conversion control node, and the switch control circuit is configured to control the first terminal of the energy storage circuit to be connected to or disconnected from the conversion control node under the control of a switch control signal provided by the switch control line;
   the discharge control circuit is electrically connected to the conversion control node and a first voltage terminal, and the discharge control circuit is configured to control the conversion control node to be connected to or disconnected from the first voltage terminal under the control of a potential of the conversion control node; and
   the voltage conversion circuit is electrically connected to the conversion control node, a second voltage terminal, a third voltage terminal and an output terminal, and the voltage conversion circuit is configured to control, under the control of a second voltage signal provided by the second voltage terminal and the potential of the conversion control node, a voltage signal outputted by the output terminal according to the second voltage signal and/or a third voltage signal provided by the third voltage terminal.

2. The sensing circuit according to claim 1, wherein the voltage conversion circuit comprises a first conversion circuit and a second conversion circuit;
   the first conversion circuit is electrically connected to the conversion control node, the output terminal and the third voltage terminal, and the first conversion circuit is configured to control the output terminal to be connected to or disconnected from the third voltage terminal under the control of the potential of the conversion control node; and
   the second conversion circuit is electrically connected to the second voltage terminal and the output terminal, and the second conversion circuit is configured to control the output terminal to be connected to or disconnected from the second voltage terminal under the control of the second voltage signal provided by the second voltage terminal.

3. The sensing circuit according to claim 1, wherein the first conversion circuit comprises a first transistor; and a control electrode of the first transistor is electrically connected to the conversion control node, a first electrode of the first transistor is electrically connected to the output terminal, and a second electrode of the first transistor is electrically connected to the third voltage terminal.

4. The sensing circuit according to claim 1, wherein the second conversion circuit comprises a second transistor; and
   a control electrode of the second transistor and a first electrode of the second transistor are electrically connected to the second voltage terminal, and a second electrode of the second transistor is electrically connected to the output terminal.

5. The sensing circuit according to claim 1, wherein the photoelectric conversion element comprises a photodiode, and the energy storage circuit comprises a storage capacitor; a first terminal of the storage capacitor is the first terminal of the energy storage circuit; and
   a cathode of the photodiode is electrically connected to the first terminal of the storage capacitor, an anode of the photodiode is electrically connected to a second terminal of the storage capacitor, and the second terminal of the storage capacitor is electrically connected to a bias voltage terminal.

6. The sensing circuit according to claim 1, wherein the switch control circuit comprises a third transistor; and
   a control electrode of the third transistor is electrically connected to the switch control line, a first electrode of the third transistor is electrically connected to the conversion control node, and a second electrode of the third transistor is electrically connected to a first terminal of the energy storage circuit.

7. The sensing circuit according to claim 1, wherein the discharge control circuit comprises a fourth transistor; and
   a first electrode of the fourth transistor is electrically connected to the first voltage terminal, and a control electrode of the fourth transistor and a second electrode of the fourth transistor are electrically connected to the conversion control node.

8. A detection control method, applied to the sensing circuit according to claim 1, wherein a detection period comprises a reset stage and a detection stage arranged in sequence; the detection stage comprises a discharge time segment and a holding time segment; the detection control method comprises:
   in the reset stage, controlling, by the switch control circuit, the first terminal of the energy storage circuit to be the disconnected from the conversion control node under the control of the switch control signal, and controlling, by the voltage conversion circuit under the control of the second voltage signal and the potential of the conversion control node, to output the second voltage signal through the output terminal;
   at the beginning of the discharge time segment, controlling, by the switch control circuit, the first terminal of the energy storage circuit to be connected to the conversion control node under the control of the switch control signal, and controlling, by the photoelectric conversion element, the potential of the first terminal of the energy storage circuit to be changed according to the received optical signal, and controlling, by the voltage conversion circuit under the control of the second voltage signal and the potential of the conversion control node, to output a fourth voltage signal through the output terminal according to the second voltage signal and the third voltage signal;

in the discharge time segment, controlling, by the discharge control circuit, the conversion control node to be connected to the first voltage terminal under the control of the potential of the conversion control node, so that charges stored in the energy storage circuit is discharged to the first voltage terminal so as to change the potential of the conversion control node accordingly, and wherein the discharge time segment is ended when the second voltage signal is controlled, by the voltage conversion circuit under the control of the potential of the conversion control node, to be outputted through the output terminal; and in the holding time segment, controlling, by the voltage conversion circuit, to output the second voltage signal through the output terminal under the control of the potential of the conversion control node.

9. The detection control method according to claim 8, wherein the voltage conversion circuit comprises a first conversion circuit and a second conversion circuit;

the step of controlling, by the voltage conversion circuit under the control of the second voltage signal and the potential of the conversion control node, to output the second voltage signal through the output terminal comprises:

controlling, by the first conversion circuit under the control of the potential of the conversion control node, the output terminal to be disconnected from the third voltage terminal; controlling, by the second conversion circuit under the control of the second voltage signal, the output terminal to be connected to the second voltage terminal; and the step of controlling, by the voltage conversion circuit under the control of the second voltage signal and the potential of the conversion control node, to output the fourth voltage signal through the output terminal according to the second voltage signal and the third voltage signal comprises:

controlling, by the first conversion circuit under the control of the potential of the conversion control node, the output terminal to be connected to the third voltage terminal; controlling, by the second conversion circuit under the control of the second voltage signal, the output terminal to be connected to the second voltage terminal.

10. A fingerprint identification module, comprising an identification circuit and a sensing circuit; wherein the sensing circuit comprises: a photoelectric conversion element, an energy storage circuit, a switch control circuit, a discharge control circuit, and a voltage conversion circuit, wherein a first terminal of the energy storage circuit is electrically connected to the photoelectric conversion element, and the energy storage circuit is configured to store electrical energy;

the photoelectric conversion element is configured to control a potential of the first terminal of the energy storage circuit according to a received optical signal;

the switch control circuit is electrically connected to a switch control line, the first terminal of the energy storage circuit and a conversion control node, and the switch control circuit is configured to control the first terminal of the energy storage circuit to be connected to or disconnected from the conversion control node under the control of a switch control signal provided by the switch control line;

the discharge control circuit is electrically connected to the conversion control node and a first voltage terminal, and the discharge control circuit is configured to control the conversion control node to be connected to or disconnected from the first voltage terminal under the control of a potential of the conversion control node; and the voltage conversion circuit is electrically connected to the conversion control node, a second voltage terminal, a third voltage terminal and an output terminal, and the voltage conversion circuit is configured to control, under the control of a second voltage signal provided by the second voltage terminal and the potential of the conversion control node, a voltage signal outputted by the output terminal according to the second voltage signal and/or a third voltage signal provided by the third voltage terminal;

the identification circuit is electrically connected to the output terminal comprised in the sensing circuit; and the identification circuit is configured to perform a fingerprint identification according to the voltage signal outputted by the output terminal.

11. The fingerprint identification module according to claim 10, wherein the identification circuit comprises a signal providing circuit, a time measurement circuit, and a master control circuit;

the signal providing circuit is electrically connected to the switch control line and the signal providing circuit is configured to provide the switch control signal to the switch control line;

the time measurement circuit is electrically connected to the output terminal, and the time measurement circuit is configured to detect a time in which the voltage signal outputted by the output terminal is the fourth voltage signal; and the master control circuit is electrically connected to the time measurement circuit, and the master control circuit is configured to calculate an intensity of the optical signal received by the photoelectric conversion element according to the time, and perform the fingerprint identification according to the intensity of the optical signal.

12. A display apparatus, comprising a fingerprint identification module, wherein the fingerprint identification module comprises an identification circuit and a sensing circuit;

wherein the sensing circuit comprises: a photoelectric conversion element, an energy storage circuit, a switch control circuit, a discharge control circuit, and a voltage conversion circuit, wherein a first terminal of the energy storage circuit is electrically connected to the photoelectric conversion element, and the energy storage circuit is configured to store electrical energy;

the photoelectric conversion element is configured to control a potential of the first terminal of the energy storage circuit according to a received optical signal;

the switch control circuit is electrically connected to a switch control line, the first terminal of the energy storage circuit and a conversion control node, and the switch control circuit is configured to control the first terminal of the energy storage circuit to be connected to or disconnected from the conversion control node under the control of a switch control signal provided by the switch control line;

the discharge control circuit is electrically connected to the conversion control node and a first voltage terminal, and the discharge control circuit is configured to control the conversion control node to be connected to or disconnected from the first voltage terminal under the control of a potential of the conversion control node; and the voltage conversion circuit is electrically connected to the conversion control node, a second voltage terminal, a third voltage terminal and an output terminal, and the voltage conversion circuit is configured to control, under the control of a second voltage signal provided by the second voltage terminal and the potential of the conversion control node, a voltage signal outputted by the output terminal according to the second voltage signal and/or a third voltage signal provided by the third voltage terminal;

the identification circuit is electrically connected to the output terminal comprised in the sensing circuit; and the identification circuit is configured to perform a fingerprint identification according to the voltage signal outputted by the output terminal.

13. The display apparatus according to claim 12, wherein the identification circuit comprises a signal providing circuit, a time measurement circuit, and a master control circuit;

the signal providing circuit is electrically connected to the switch control line and the signal providing circuit is configured to provide the switch control signal to the switch control line;

the time measurement circuit is electrically connected to the output terminal, and the time measurement circuit is configured to detect a time in which the voltage signal outputted by the output terminal is the fourth voltage signal; and the master control circuit is electrically connected to the time measurement circuit, and the master control circuit is configured to calculate an intensity of the optical signal received by the photoelectric conversion element according to the time, and perform the fingerprint identification according to the intensity of the optical signal.

14. The display apparatus according to claim 12, wherein the voltage conversion circuit comprises a first conversion circuit and a second conversion circuit;

the first conversion circuit is electrically connected to the conversion control node, the output terminal and the third voltage terminal, and the first conversion circuit is configured to control the output terminal to be connected to or disconnected from the third voltage terminal under the control of the potential of the conversion control node; and the second conversion circuit is electrically connected to the second voltage terminal and the output terminal, and the second conversion circuit is configured to control the output terminal to be connected to or disconnected from the second voltage terminal under the control of the second voltage signal provided by the second voltage terminal.

15. The display apparatus according to claim 12, wherein the first conversion circuit comprises a first transistor; and a control electrode of the first transistor is electrically connected to the conversion control node, a first electrode of the first transistor is electrically connected to the output terminal, and a second electrode of the first transistor is electrically connected to the third voltage terminal.

16. The display apparatus according to claim 12, wherein the second conversion circuit comprises a second transistor; and a control electrode of the second transistor and a first electrode of the second transistor are electrically connected to the second voltage terminal, and a second electrode of the second transistor is electrically connected to the output terminal.

17. The display apparatus according to claim 12, wherein the photoelectric conversion element comprises a photodiode, and the energy storage circuit comprises a storage capacitor; a first terminal of the storage capacitor is the first terminal of the energy storage circuit; and a cathode of the photodiode is electrically connected to the first terminal of the storage capacitor, an anode of the photodiode is electrically connected to a second terminal of the storage capacitor, and the second terminal of the storage capacitor is electrically connected to a bias voltage terminal.

18. The display apparatus according to claim 12, wherein the switch control circuit comprises a third transistor; and a control electrode of the third transistor is electrically connected to the switch control line, a first electrode of the third transistor is electrically connected to the conversion control node, and a second electrode of the third transistor is electrically connected to a first terminal of the energy storage circuit.

19. The display apparatus according to claim 12, wherein the discharge control circuit comprises a fourth transistor; and a first electrode of the fourth transistor is electrically connected to the first voltage terminal, and a control electrode of the fourth transistor and a second electrode of the fourth transistor are electrically connected to the conversion control node.

* * * * *